US007668205B2

(12) United States Patent
Putnam

(10) Patent No.: US 7,668,205 B2
(45) Date of Patent: Feb. 23, 2010

(54) METHOD, SYSTEM AND PROGRAM PRODUCT FOR THE INSERTION AND RETRIEVAL OF IDENTIFYING ARTIFACTS IN TRANSMITTED LOSSY AND LOSSLESS DATA

(75) Inventor: Jon S. Putnam, Goodyear, AZ (US)

(73) Assignee: CELO Data, Inc., Austin, TX (US)

( * ) Notice: Subject to any disclaimer, the term of this patent is extended or adjusted under 35 U.S.C. 154(b) by 503 days.

(21) Appl. No.: 11/533,697

(22) Filed: Sep. 20, 2006
(Under 37 CFR 1.47)

(65) Prior Publication Data

US 2008/0084949 A1 Apr. 10, 2008

Related U.S. Application Data

(60) Provisional application No. 60/718,908, filed on Sep. 20, 2005.

(51) Int. Cl.
*H04J 3/24* (2006.01)
*H03D 1/04* (2006.01)
*H03H 7/30* (2006.01)
*H04J 3/16* (2006.01)

(52) U.S. Cl. ........................ 370/474; 370/346; 380/252; 382/232; 375/238; 704/E19.009

(58) Field of Classification Search ............. 380/36–52, 380/202, 206, 252; 725/22, 32, 42; 348/E5.002, 348/E7.031, 473; 370/204, 346, 474; 386/E5.004; 375/E7.09, E7.167, E7.129, E7.134, 238, 375/346; 726/19, 30; 713/161–180; 704/E19.009, 704/E19.001; 382/100, 232
See application file for complete search history.

(56) References Cited

U.S. PATENT DOCUMENTS 4,025,851 A 5/1977 Haselwood et al.

(Continued)

FOREIGN PATENT DOCUMENTS

EP 0 859 503 A3 2/1997

(Continued)

OTHER PUBLICATIONS

Putnam, Method, System and Program Product for the Insertion and Retrieval of Identifying Artifacts in Transmitted Lossy and Lossless Data, PCT Notification of Transmittal of the International Search Report and The Written Opinion of the International Searching Authority, or the Declaration, Aug. 7, 2007, PCT/US06/36663, CeloData, Inc.

(Continued)

*Primary Examiner*—Afsar M. Qureshi
(74) *Attorney, Agent, or Firm*—Dillon & Yudell LLP

(57) ABSTRACT

Identifying artifacts are inserting in radio frequency broadcast data at the transmitter and retrieved at a receiver, allowing verification of the receipt of the transmitted data, authentication of transactions that use the transmitted data, or activation of processes dependent on receipt of the carrier data. A content system receives content data to serve as carrier data, and an identifying artifact insertion system inserts artifact data into the carrier data based on predetermined characteristics of the carrier data without requiring human intervention, and then generates a composite data sequence. A data transmit system connected to the identifying artifact insertion system and the content system transmits the composite data sequence. A receiver system performs real-time, automated extraction of identifying artifacts within lossy carrier data and verifies the reception of the data artifacts in the carrier data.

41 Claims, 6 Drawing Sheets

U.S. PATENT DOCUMENTS

| | | | |
|---|---|---|---|
| 4,457,804 A | 7/1984 | Reinhall | |
| 4,497,060 A * | 1/1985 | Yang | 375/238 |
| 4,639,779 A | 1/1987 | Greenberg | |
| 4,805,020 A | 2/1989 | Greenberg | |
| 4,876,617 A * | 10/1989 | Best et al. | 360/60 |
| 4,876,671 A | 10/1989 | Norwood et al. | |
| 5,113,437 A | 5/1992 | Best et al. | |
| 5,128,933 A | 7/1992 | Baranoff-Rossine | |
| 5,319,735 A | 6/1994 | Preuss et al. | |
| 5,379,345 A | 1/1995 | Greenberg | |
| 5,450,122 A | 9/1995 | Keene | |
| 5,450,490 A | 9/1995 | Jensen et al. | |
| 5,613,004 A | 3/1997 | Cooperman et al. | |
| 5,636,292 A | 6/1997 | Rhoads | |
| 5,663,766 A | 9/1997 | Sizer, II | |
| 5,687,236 A | 11/1997 | Moskowitz et al. | |
| 5,737,025 A | 4/1998 | Dougherty et al. | |
| 5,828,270 A | 10/1998 | Chang | |
| 5,850,481 A | 12/1998 | Rhoads | |
| 5,889,868 A | 3/1999 | Moskowitz et al. | |
| 5,905,800 A | 5/1999 | Moskowitz et al. | |
| 5,940,135 A | 8/1999 | Petrovic et al. | |
| 6,026,193 A * | 2/2000 | Rhoads | 382/232 |
| 6,047,374 A | 4/2000 | Barton | |
| 6,101,604 A | 8/2000 | Barton | |
| 6,163,842 A | 12/2000 | Barton | |
| 6,205,249 B1 | 3/2001 | Moskowitz | |
| 6,216,228 B1 | 4/2001 | Chapman et al. | |
| 6,285,774 B1 | 9/2001 | Schumann et al. | |
| 6,625,295 B1 * | 9/2003 | Wolfgang et al. | 382/100 |
| 6,721,437 B1 | 4/2004 | Ezaki et al. | |
| 7,124,442 B2 | 10/2006 | Nash-Putnam | |
| 2002/0076043 A1 | 6/2002 | Van Der Vleuten et al. | |
| 2003/0021414 A1 * | 1/2003 | Nash-Putnam | 380/252 |

FOREIGN PATENT DOCUMENTS

| | | |
|---|---|---|
| EP | 0 899 688 A2 | 3/1999 |
| EP | 1 031 944 A1 | 8/2000 |
| EP | 1 063 833 A2 | 12/2000 |
| EP | 1 075 108 A1 | 2/2001 |
| EP | 1 079 627 A1 | 2/2001 |
| WO | WO 00/25203 | 5/2000 |
| WO | WO 00/54453 | 9/2000 |
| WO | WO/01/22652 A2 | 3/2001 |
| WO | WO 01/45316 A1 | 6/2001 |
| WO | WO 01/45410 A2 | 6/2001 |

OTHER PUBLICATIONS

Zeng, Fan-Gang, Interactions of Forward Masking and Simultaneous Masking in Intensity Discrimination. Journal of Acoustic Society of America, 1998, vol. 103, pp. 2021-2030.

Wehr, Michael and Zador, A.M., Synaptic Mechanisms of Forward Suppression in Rat Auditory Cortex, Neuron, 2005, vol. 47, pp. 473-445.

Meddis, Ray and O'Mard, L.P., Computer Model of the Auditory-Nerve Response to Forward Masking Stimuli, Journal of Acoustic Society America, 2005, vol. 117, pp. 3788-3798.

Langemann, U. and G.M. Klump, Signal Detection in Amplitude-Modulated Maskers, European Journal of Neuroscience, 2001, vol. 13, pp. 1025-1032.

Jones, E.G., Viewpoint: The core and Matrix of Thalamic Organization, Neuroscience, 1998 vol. 85, pp. 331-345.

Heinz, Michael G., Colburn, H.S., and Carney, L.H., Quantifying the Implications of Non-linear Tuning for Auditory-Filter Estimates. Journal of Acoustic Society of America, 2002, vol. 111, pp. 978-990.

Gockel, Hedwig, et al. Louder Sounds Can Produce Less Forward Masking: Effects of Component Phase in Complex Tones, Journal of Acoustic Society of America, 2003 vol. 114, pp. 114,978-990.

Denham, Susan L., A Model of Temporal Response Properties in Primary Auditory Cortex, 2001.

* cited by examiner

METHOD, SYSTEM AND PROGRAM PRODUCT FOR THE INSERTION AND RETRIEVAL OF IDENTIFYING ARTIFACTS IN TRANSMITTED LOSSY AND LOSSLESS DATA

PRIORITY CLAIM

The application claims the benefit of priority under 35 U.S.C. §119(e) from U.S. Provisional Application No. 60/718,908, entitled, "A System and Method for the Insertion and Retrieval of Identifying Artifacts in Transmitted Lossy and Lossless Data," filed on Sep. 20, 2005, which is incorporated herein by reference in its entirety.

CROSS-REFERENCE TO RELATED APPLICATIONS

The present application is related to the following co-pending U.S. patent applications filed on even date herewith, owned by the assignee hereof, and are hereby incorporated herein by reference in their entirety:

Ser. No. 11/533,748, entitled "Method, System And Program Product for Broadcast Advertising and Other Broadcast Content Performance Verification Utilizing Digital Artifacts"

Ser. No. 11/533,754, entitled "Method, System And Program Product for Broadcast Error Protection of Content Elements Utilizing Digital Artifacts"

Ser. No. 11/533,760, entitled "Method, System and program product for Broadcast Operations Utilizing Internet Protocol and Digital Artifacts"

BACKGROUND OF THE INVENTION

1. Field of the Invention

The present invention relates generally to verification, authentication or identification systems, methods and program products, and more particularly, it relates to inserting and detecting identifying data artifacts within lossy and lossless transmitted data.

2. Description of the Related Art

Systems for identifying, verifying, or authenticating transmitted data are known in the art. Such systems allow a transmitted data signal, also known as carrier data, to be marked with a verification code sequence identifying the owner, time of production, title, or other suitable data. The verification code sequence is used to identify the carrier data so as to verify performance of the carrier data, determine the source of the carrier data, or perform other suitable functions.

Various prior art methods of injecting additional information onto carrier data sequences are known. For example, the time domain may be used for digital information injection. It is known to pulse-width modulate a signal to provide a common or encoded signal carrying at least two information elements or other useful elements. In U.S. Pat. No. 4,497,060 to Yang (1985) binary data is transmitted as a signal having two differing pulse-widths to represent logical "0" and "1" (e.g., the pulse-width durations for a "1" are twice the duration for a "0"). This correspondence also enables the determination of a clocking signal.

Other examples use the frequency domain for digital information injection. U.S. Pat. Nos. 4,876,617 to Best et al. (1989) and 5,113,437 to Best et al. (1992) disclose encoders for forming relatively thin and shallow (e.g., 150 Hz wide and 50 dB deep) notches in mid-range frequencies of an audio signal. The earlier of these patents discloses paired notch filters centered about the 2883 Hz and 3417 Hz frequencies; the later patent discloses notch filters but with randomly varying frequency pairs to discourage erasure or inhibit filtering of the information added to the notches. The encoders then add digital information in the form of signals in the lower frequency indicating a "0" and in the higher frequency a "1". In the later Best et al. patent an encoder samples the audio signal, delays the signal while calculating the signal level, and determines during the delay whether or not to add the data signal and, if so, at what signal level. The later Best et al. patent also notes that the "pseudo-random manner" in moving the notches makes the data signals more difficult to detect audibly.

Other prior art uses a combination of phase, time and frequency domains to impart digital information on lossy and lossless carrier data. In U.S. Pat. No. 5,940,135 to Petrovic et al. (1999), an encoder employs the preprocessing of a slowly varying phase distortion coupled with a complex echo hiding system, involving multiple time-varying echoes to instill a digital watermark on a pre-recorded carrier.

Digital watermarks are effective in applications such as digital rights management for compact discs (CDs) and digital video discs (DVDs) where the attribution of the watermarked carrier is permanently identified with a single source such as a studio, publisher or performing artist, and multiple copies of the carrier are to be distributed. The digital watermark fails in efficacy where the identification, verification or authentication must be attributed to multiple sources such as the purchasers of broadcast radio or television advertising time that are not associated with the producer of the digital watermarked advertising content provided to the broadcaster. Digital watermarking systems for audio carriers such as U.S. Pat. No. 5,940,135 to Petrovic et al. (1999) generally employ techniques that in some way manipulate the carrier in either the phase, time or frequency domains, or any number of permutations of the three. These approaches appear to the accomplished listener as audible degradations of the audio carrier.

Other known identification injecting methods use frequency spread spectrum techniques to periodically inject time-stamp and identification information into master audio recordings for the purpose of recovering this time and identification data for performance verification. U.S. Pat. No. 5,379,345 to Greenberg (1995) is one such example. This approach, like digital watermarking, while effective in identifying mass copies of advertising content, fails in efficacy where the encoded identification points to an individual or entity other than the purchaser of the radio or television broadcast advertising time seeking proof of performance.

Another instance of the use of frequency spread spectrum techniques coupled with encryption that also injects a time stamp and identification information is U.S. patent application Ser. No. 09/915,174 to Nash-Putnam (2001). This approach, like Greenberg above, injects the identifier specifically in real-time and at the time of transmission. The approach suffers from a failing, which is typical of frequency spread spectrum techniques, in that the frequency spreading appears as noise in the audio carrier. In the absence of audio data carrier components to mask the code frequencies, they can become audible. This method, therefore, relies on the asserted noise-like character of the codes to suggest that their presence will be ignored by listeners. However, in the case of an accomplished listener this assumption may not be valid, for example, in the case of recorded music containing passages with relatively little audio carrier content or during pauses in speech.

Other forms of identification, verification, and authentication rely on digital fingerprinting or other related pattern recognition techniques. These approaches require prior knowledge of the subject carrier, which are not available in real-time. Also, such comparison techniques are of only limited reliability due to normal degradation of the signal due to airborne broadcast transmission, such as electromagnetic interference, multi-path transmission errors, and a number of other environmental disturbances. These forms of pattern comparison of a portion of an audio carrier can be utilized for identification purposes, but the comparison requires significant analysis and has a high probability of inaccuracy.

Still other prior art techniques employ the psychoacoustic model of the human perception characteristic, more specifically temporal masking, to insert modulated or unmodulated tones into carrier data such that they will be masked by existing frequency components, and thus not perceived, e.g. U.S. Pat. No. 5,319,735 to Preuss et al. (1994) and U.S. Pat. No. 5,450,490 to Jensen et al. (1998). Such techniques are expensive and complicated to implement, while suffering from a susceptibility to degradation in the face of environmental signal distortions or distortions imposed by perception-based compression schemes designed to eliminate masked signal components.

The prior art fails to provide a relatively simple system and method for the insertion and retrieval of identifying artifacts in lossy or lossless carriers. The prior art also fails to provide systems and methods for the continuous, real-time insertion and retrieval of digital artifacts in lossy and lossless carrier data sequences that produces humanly perceived audio transmissions with inaudible artifacts defining digital information.

SUMMARY OF THE INVENTION

In accordance with preferred embodiments of the present invention, improved methods, systems and program products for inserting and retrieving identifying artifacts in transmitted data and allowing verification of the receipt of the transmitted data, authentication of transactions that use the transmitted data, or automated activation of processes based on the transmitted data. In accordance with an exemplary embodiment of the present invention, a system for inserting and detecting identifying artifacts in transmitted data includes a content system receiving content data to serve as carrier data, and an identifying artifact insertion system that inserts artifact data into the carrier data based on predetermined characteristics of the carrier data, and then generates a composite data sequence. A data transmit system connected to the identifying artifact insertion system and the content system transmits the composite data sequence. In this manner, identification data can be inserted into the carrier data without requiring human intervention. A receiver system performs real-time, automated extraction of identifying artifacts within lossy carrier data and verifies the reception of the data artifacts in the carrier data, so as to allow verification of transmissions, authentication of transactions, and activation of processes dependent on receipt of the carrier data.

All objects, features, and advantages of the present invention will become apparent in the following detailed written description.

BRIEF DESCRIPTION OF THE DRAWINGS

In the following detailed description of exemplary embodiments of the invention, reference is made to the accompanying drawings, which form a part hereof, and in which is shown by way of illustration specific exemplary embodiments in which the invention may be practiced, as follows.

In the accompanying drawings, in which like numbers represent the same or similar elements and one or a plurality of such elements, features might not be to scale and may be shown in generalized or schematic form or may be identified solely by name or other commercial designation.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims. In particular, although the preferred embodiment is described below with primary respect to a radio broadcast system, it will be appreciated that the present invention is not limited to such implementations, and may be implemented in radio, television, Internet, cellular, Wi-Fi, Wi-MAX, satellite, local area network, wide area network, a public switched telephone network, a wireless network, fiber-optic network, microwave transmission link and other broadcast systems.

Figure 1:
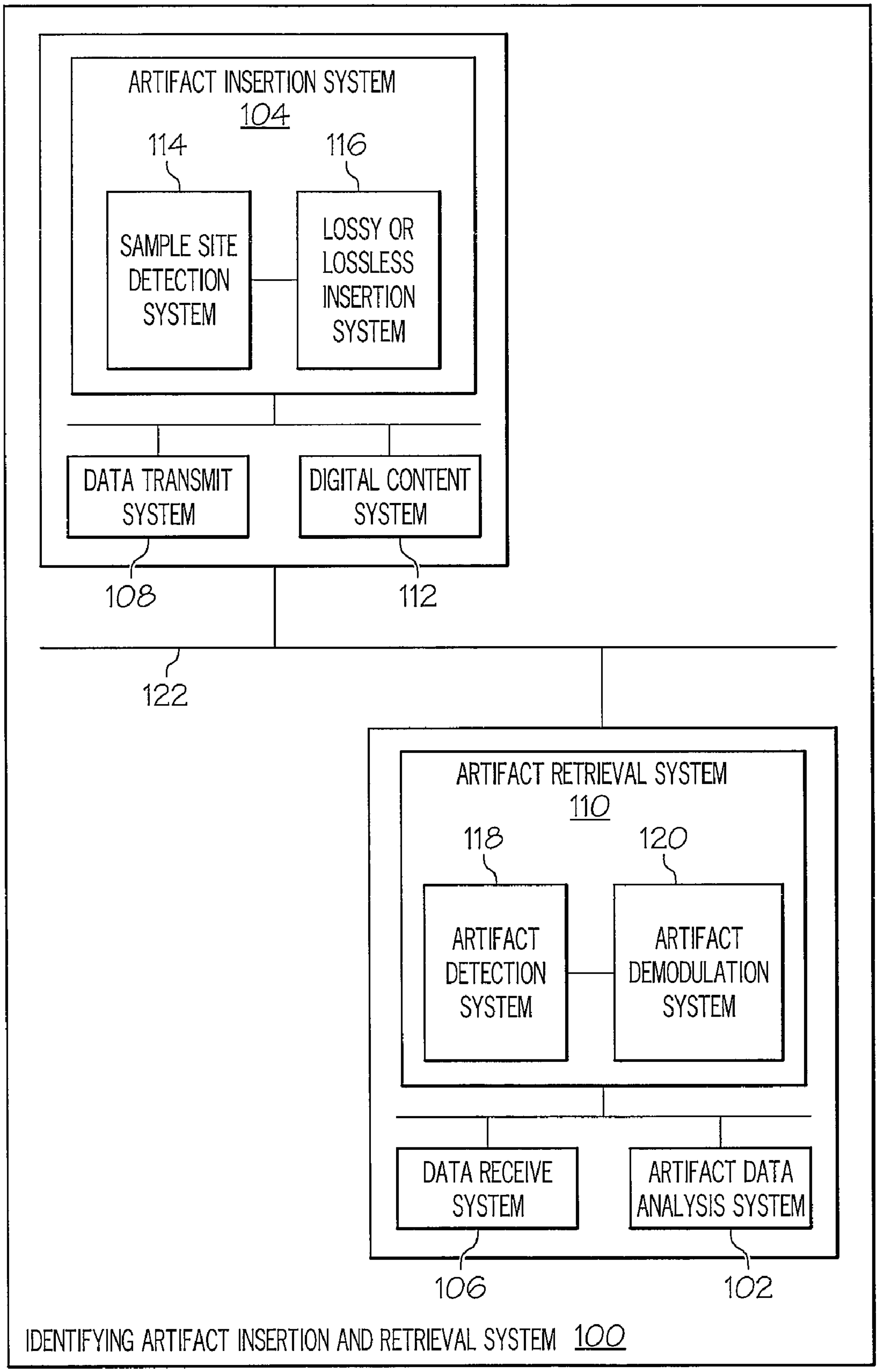
FIG. 1 is a diagram of a system for the insertion and retrieval of identifying data in transmitted data in accordance with an exemplary embodiment of the present invention.

FIG. 1 is a diagram of a system 100 for the insertion and retrieval of identifying artifacts in transmitted data in accordance with an exemplary embodiment of the present invention. System 100 performs real-time, automated insertion of identifying artifacts within carrier data and verifies the reception of the data artifacts in the carrier data, so as to allow the identification of carrier content, the authentication of transactions, and the activation of processes dependent on the verified receipt of the carrier data.

System 100 includes content system 102, which can be implemented in hardware, software, or a suitable combination of hardware and software, and which can be one or more software systems operating on a general purpose server platform. As used herein, a software system can include one or more objects, agents, threads, subroutines, separate software applications, two or more lines of code or other suitable software structures operating in two or more separate software applications, on two or more different processors, or other suitable software architectures. In one exemplary embodiment, a software system can include one or more lines of code or other suitable software structures operating in a general purpose software application, such as an operating system, and one or more lines of code or other suitable software structures operating in a specific purpose software application. In another exemplary embodiment, a software system can be one or more lines of hypertext markup language (HTML), extensible markup language (XML), a web browser plug-in, or other suitable code that operates in conjunction with a web browser application.

Content system 102 is coupled to artifact insertion system 104, data transmit system 106, data receive system 108, artifact retrieval system 110 and artifact data analysis system 112 via communications medium 122. As used herein, the term "couple," and its cognate terms such as "couples" and "coupled," can include a physical connection (such as through one or more copper conductors), a virtual connection (such as one or more randomly assigned data memory locations of a data memory device), a logical connection (such as through one or more logical devices of a semiconducting circuit), a wireless connection, a hypertext transfer protocol (HTTP) connection, radio frequency broadcast transmission, or other suitable connections, or a suitable combination of such connections. In one exemplary embodiment, systems and components can be coupled to other systems and components through intervening systems and components, such as through an operating system of a general purpose server platform.

Communications medium 122 can be the Internet, a local area network, a wide area network, the public switched telephone network, a wireless network, fiber-optic network, microwave transmission link, radio frequency broadcast transmitter and receiver, or other suitable communications media, or a suitable combination of such communications media.

In one exemplary embodiment, content system 102 can provide digital carrier data to the artifact insertion system 104. The digital carrier data can be lossy data (such as sampled audio or video frequency data), lossless data (such as audio or video data initially captured in a digital modality), or other suitable data.

Artifact insertion system 104 includes a sample site detection system 114 and a lossy and lossless insertion system 116 each of which can be implemented in hardware, software, or a suitable combination of hardware and software, and which can be one or more software systems operating on a general purpose server platform. In one exemplary embodiment, artifact insertion system 104 receives the carrier data, artifact data, and other suitable data from content system 102 and generates a composite data sequence. The composite data sequence can be comprised of the carrier data, one or more instances of the artifact data, one or more flag data sequences, and other suitable data. Artifact insertion system 104 then provides the composite data sequence to data transmit system 106.

Lossy or lossless insertion system 116 receives lossy or lossless carrier amplitude samples and artifact amplitude samples, and inserts the artifact data into the lossy or lossless carrier data in real-time. In one exemplary embodiment, the artifact samples can represent data used to verify receipt of the carrier samples, date and time stamp data, quality of transmission data (such as data that is used to determine whether the transmission quality meets minimum predetermined criteria), advertiser identification data, broadcaster identification data, or other suitable data. Lossy or lossless insertion system 116 then generates the composite data sequence that includes the lossy or lossless carrier amplitude samples and the identifying artifact amplitude samples modulated to emulate the surrounding carrier data. In one exemplary embodiment, sample site detection system 114 analyzes the carrier amplitude samples to identify areas having a predetermined amplitude value fluctuation, such as areas in which the standard deviation exceeds a predetermined value, areas in which the absolute magnitude of the change in two or more successive sample amplitudes exceeds a predetermined value, or other suitable areas. The artifact amplitude samples can then be modulated into the carrier data following that location, and utilize a repeatable measurement within the composite carrier signal as a flag. In another exemplary embodiment, the sample site detection system 114 counts a predetermined number of carrier samples established and known to both the artifact insertion system 104 and the artifact retrieval system 110 and causes the lossy or lossless insertion system 116 to insert an identifying artifact at that site.

In one exemplary embodiment, the identifying data is contained in an artifact of short duration where the variation in the composite carrier minimizes the likelihood that the variation in the composite carrier will be detected, such as by the human ear for audio data, by the human eye for video data, or by other suitable procedures. This short duration variation, although significant enough to be detected by automated computer processes, is in the case of audio data simultaneously masked by the surrounding carrier data content. Furthermore, insertion of the artifact data in an area in which the data signal value fluctuations exceed a predetermined level decreases the likelihood that any variation in the carrier signal will be detected, such as by the human ear for audio data, by the human eye for video data, or by other suitable procedures. Simultaneous masking, an idiosyncrasy of the human auditory system, may be employed to disguise significant amounts of data within lossy and lossless audio carriers or composite audio and video carriers. Data insertions of short duration which are variations in the amplitude of the lossy or lossless carrier sample, when inserted frequently into a lossy or lossless audio or a lossy or lossless composite audio and video carrier, are inaudible to the human ear. The short sample sets, containing typically 20 to 30 samples, appear individually at exaggerated sound pressure levels to be clicks or pops, but when inserted into a carrier at sample interval shorter than 1,000 samples are perceived in the absence of other audio stimuli to be a frequency proportional to the insertion interval. For example, sample set insertions every 100 samples at a sampling rate of 44,100 samples per second are perceived as a 441 Hz tone in the absence of other auditory stimuli and at exaggerated sound pressure levels. This psychoacoustic perception of amplitude variations as a tone frequency is simultaneously masked by adjacent frequency bands in the carrier when both frequencies arrive simultaneously at the basilar membrane of the human cochlea. The resulting effect is to make the bursts of data inaudible at sound pressure levels usual and customary in casual listening.

Data transmit system 106 can be implemented in hardware, software, or a suitable combination of hardware and software, and can be a radio frequency transmitter station in the case of both lossy and lossless data, or one or more software systems operating on a general purpose processing platform in the case of lossless data. In one exemplary embodiment, data transmit system 106 can be an account, a folder, a database or other suitable system on a server of a radio or television broadcast station or other suitable broadcasting authority or organization. Data transmit system 106 transmits the composite data sequence, and other suitable data to data receive system 108 over communications medium 122. For example, data transmit system 106 can transmit radio advertisement data to a receiver. The radio advertisement data can include identifying artifact data that contains broadcast date and time stamp data, copyright data, station identification data, quality of transmission data, or other suitable data.

Data receive system 108 can be implemented in hardware, software, or a suitable combination of hardware and software, and can be a radio frequency receiver in the case of both lossy and lossless data, one or more software systems operating on a general purpose processing platform in the case of lossless data, or other suitable systems. In one exemplary embodiment, data receive system 108 can be an account, a folder, a database or other suitable system on a server of a radio or television broadcast station or other suitable broadcasting authorities or organizations. In another exemplary embodiment, data receive system 108 can be a transmission receiving authority or organization which receives lossy and lossless data from one or more broadcasting stations or other suitable broadcasting authorities or organizations. Data receive system 108 receives the composite data sequence from data transmit system 106 over communications medium 122, and provides the data to artifact retrieval system 110.

Artifact retrieval system 110 includes lossy or lossless detection system 118 and error correction system 120, each of which can be implemented in hardware, software, a suitable combination of hardware and software, and which can be one or more software systems operating on a general purpose processing platform. Artifact retrieval system 110 extracts the identifying artifact data from the composite data sequence and provides the artifact data to artifact data analysis system 112.

Lossy or lossless detection system 118 receives the composite data sequence comprised of lossy data, one or more identifying artifacts, and other suitable data, and extracts the identifying data from the composite data sequence. The lossy or lossless detection system 120 may also receive the composite data sequence comprised of lossless data packets and extracts the identifying artifact data from the carrier data stream sequence.

The artifact data analysis system 112 can be implemented in hardware, software or a suitable combination of hardware and software, and can be one or more software systems operating on a general purpose processing platform. Artifact data analysis system 112 receives the artifact demodulated composite data sequence, the extracted identifying artifact data, and other suitable data. In one exemplary embodiment, artifact data analysis system 112 can verify that the received composite data sequence matches log data, has been received at the location to which the data has been transmitted, has been received from an authorized source, or that other verification data is present. In another exemplary embodiment, artifact data analysis system 112 can initiate an action upon receipt of the identifying artifact data.

In operation, system 100 performs real-time insertion and detection of identifying artifact data in carrier data. System 100 allows the insertion of authenticating codes, date and time stamps, tracking codes, control codes, other verification identifiers, and other suitable data into carrier data in a manner that does not effect the quality or use of the carrier data. In this manner, system 100 can be used to monitor carrier data and provide proof of performance of broadcast events, verify the transmission source for the enforcement of copyrights or for authentication of confidential transactions, activate processes dependent on the carrier data, or perform other suitable functions.

Figure 2:
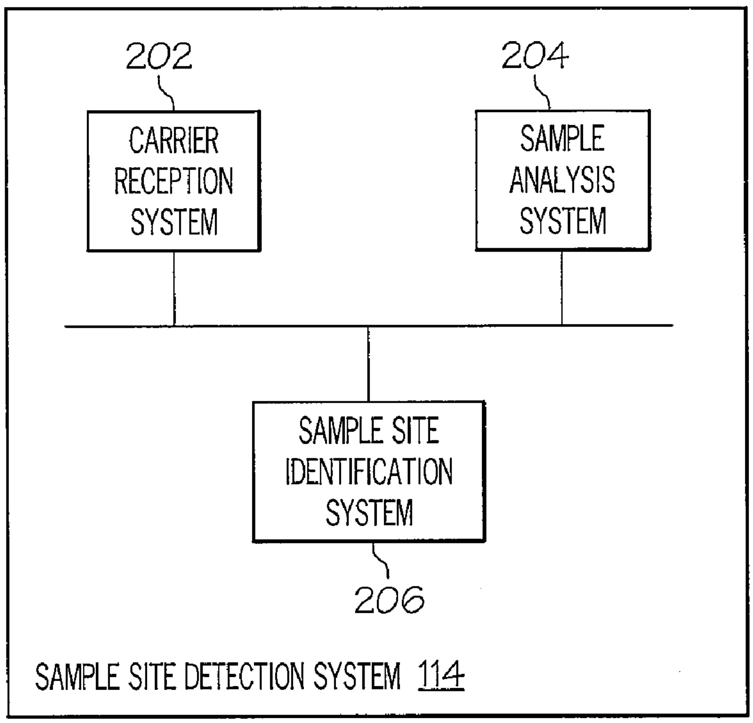
FIG. 2 is a diagram of a system for the analysis and designation of insertion sites for identifying artifacts with an exemplary embodiment of the present invention.

FIG. 2 is a diagram of a system 114 for detecting potential sample sites for inserting identifying artifacts in accordance with an exemplary embodiment of the present invention. System 114 includes carrier reception system 202, sample analysis system 204, and sample site verification system 206, each of which can be implemented in hardware, software, or suitable combination of hardware and software, and which can be one or more software systems operating on a general purposes processing platform.

Carrier reception system 202 identifies the format (such as sample rate and amplitude resolution) of the carrier and sets internal system parameters in accordance with the carrier format. The identifying artifact data can contain verification of receipt data, advertising data, date and time stamp data, quality of transmission data, broadcaster identification data, or other suitable data.

Sample analysis system 204 receives the carrier amplitude data from carrier reception system 202 and determines if the carrier sample count is of sufficient length to be modulated with one or more repetitions of the of the identifying artifact amplitude samples. In one exemplary embodiment, sample analysis system 204 determines if the sample number of the carrier sample is divisible by a predetermined artifact insertion rate. In another embodiment, the sample analysis system tests arrays of samples against predetermined amplitude or repetition parameters. For example, sample analysis system 206 can receive video, audio, or graphic image data, and can locate areas where the change in value between two sequential samples exceeds a predetermined amount. Because such changes indicate a section of data in which irregular data having a short duration would be less likely to be noticed by the human eye or ear, identifying artifact amplitude samples can be inserted before, after or within such sections in a manner that allows for automated insertion and detection. Sample analysis system 204 then provides the carrier data to sample site identification system 206.

Sample site identification system 206 receives the carrier amplitude samples from sample analysis system 204 with data about sample site insertion characteristics. Verification of the suitability of the sample site is performed by sample site identification system 206 in accordance with the characteristics data provided by sample analysis system 204. Sample site identification system 206 provides the carrier amplitude samples to lossey or lossless insertion system 116.

In operation, system 114 generates a carrier sample sequence with target areas for the insertion of the artifact amplitude samples identified, such as by using characteristics of the carrier amplitude samples that indicates an area where minor changes in the data would not be noticed or the samples that correspond in time to a predetermined insertion rate.

Figure 3:
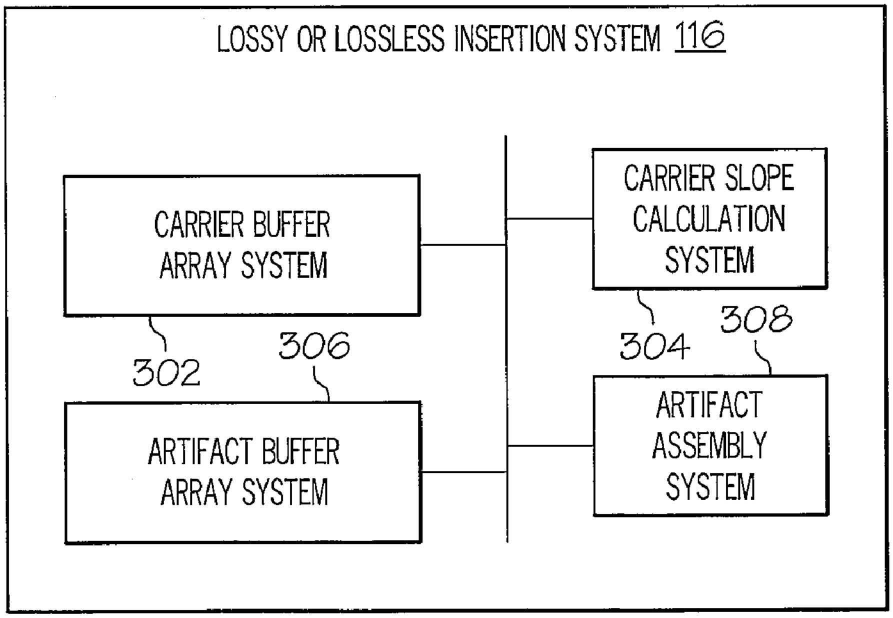
FIG. 3 is a diagram of a system for the insertion of identifying artifacts into lossy or lossless carrier data in accordance with an exemplary embodiment of the present invention.

FIG. 3 is a diagram of a system 116 for inserting the amplitude samples of an identification artifact into lossy carrier data in accordance with an exemplary embodiment of the present invention. System 116 includes carrier buffer array system 302 and carrier slope calculation system 304, artifact buffer array system 306, and artifact assembly system 308, each of which can be implemented in hardware, software, or a suitable combination of hardware and software, and which can be one or more software systems operating on a general purpose server platform.

Carrier buffer array system 302 stores an array of targeted carrier amplitude samples equal to the sample length of the identifying artifact and a predetermined number of samples before and after the targeted sample set. This array also is marked for use in carrier slope calculation system 304 and artifact assembly system 308.

Carrier slope calculation system 304 provides an algorithm for the determination of the amplitude slope of the carrier data over the potential sample series of the identifying artifact amplitude sample insertion site. Carrier slope calculation system 304 calculates the incremental slope values and provides those values to artifact assembly system 308 for use by the artifact assembly algorithm.

Artifact buffer array system 306 stores an array of amplitude samples that comprise the identifying artifact. These samples include the artifact flag and the artifact payload. The artifact flag is two or more samples of equal amplitude where the first sample is a positive integer and the second sample is a negative integer, and each successive artifact flag sample is alternatively a positive and negative integer of equal amplitude. The artifact payload data is a predetermined number of samples, where the amplitude of the samples contains the identifying data of the artifact by amplitude modulation, for example. This array is refreshed at a predetermined rate by sample data provided from the digital content system 102.

Artifact assembly system 308 assembles the carrier amplitude stream modulated by the identifying artifact. Carrier amplitude samples preceding and trailing the artifact insertion site are taken from the carrier buffer array system 302 and merged with the identifying artifact samples from the artifact buffer array system 306 which replace the carrier amplitude samples within the targeted insertion site. The result is an artifact modulated carrier data stream where the artifact flag and payload are modulated on the slope of the carrier data sequence.

In operation, system 116 stores buffered arrays of carrier and artifact amplitude samples. System 116 calculates the carrier slope which is necessary to translate or modulate the identifying artifact into a form that will readily replace the carrier data at the target sample site in such a way as to minimize the likelihood that a variation in the carrier sample stream will be detected by the human ear or the human eye. The artifact modulated carrier data is provided to data transmit system 106.

Figure 4:
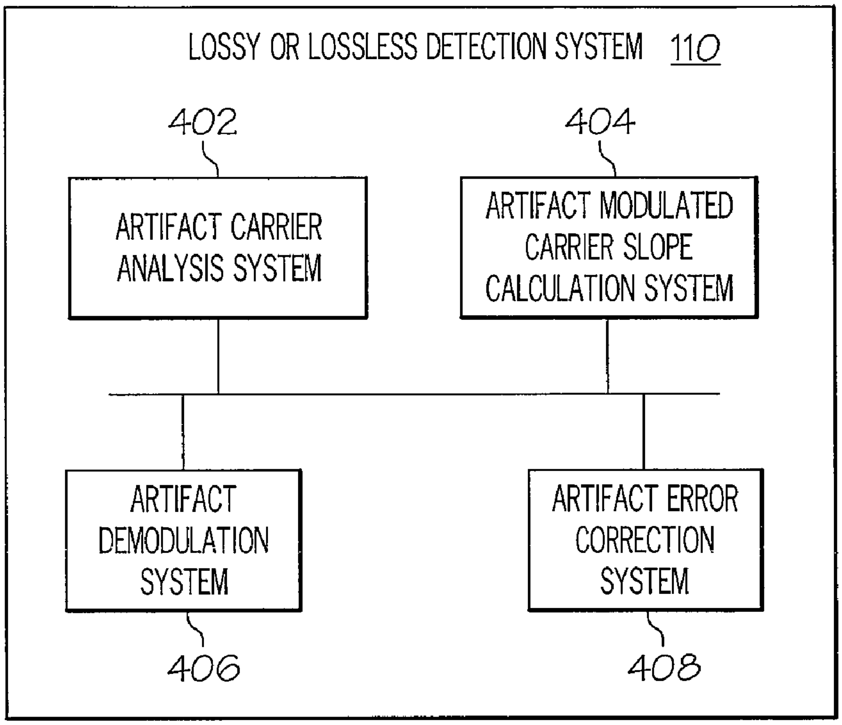
FIG. 4 is a diagram of a system for detecting identifying artifacts within the composite data sequence comprised of lossy or lossless data in accordance with an exemplary embodiment of the present invention.

FIG. 4 is a diagram of a system 110 for retrieving artifacts from within the composite sample sequence comprised of lossy or lossless samples in accordance with an exemplary embodiment of the present invention. System 110 includes artifact carrier analysis system 402, artifact modulated carrier slope calculation system 404, artifact demodulation system 406, and artifact error correction system 408, each of which can be implemented in hardware, software, or a suitable combination of hardware and software, and which can be one or more software systems operating on a general purpose server platform.

Artifact carrier analysis system 402 receives the carrier samples from data receive system 108 of FIG. 1 and determines the potential locations of identifying artifacts in artifact modulated carrier samples in accordance with predetermined parameters based on the application and the format of the carrier data. In one exemplary embodiment, artifact carrier analysis system 402 determines if the sample number of the artifact modulated carrier sample is divisible by a predetermined artifact insertion rate. In another embodiment, the sample analysis system tests arrays of samples against predetermined amplitude, repetition, or other suitable parameter.

Artifact modulated carrier slope calculation system 404 provides an algorithm for the determination of the amplitude slope of the artifact amplitude modulated carrier data over the sample series of the potential identifying artifact insertion site. Carrier slope calculation system 404 calculates the incremental slope values of the artifact amplitude modulated carrier data and provides those values to artifact demodulation system 406 for use in the artifact demodulation algorithm.

Artifact demodulation system 406 receives the artifact amplitude modulated carrier data from data receive system 108, target artifact sample sites from artifact carrier analysis system 402, and artifact amplitude modulated carrier slope incremental values from artifact amplitude modulated carrier slope calculation system 404. Artifact demodulation system 406 demodulates the identifying artifact amplitude samples from the carrier samples using an appropriate demodulation algorithm.

Artifact error correction system 408 applies appropriate error correction algorithms to remove transmission errors identified in the raw demodulated identifying artifacts. In one embodiment of the present invention, a simple error correction algorithm is applied that adjusts all raw demodulated artifact payload amplitude samples to one of three conditions; +10, −10 or 0. These conditions match an embodiment of the artifact payload archetype where a sample amplitude value of +10 is equivalent to the binary digit 1, a sample amplitude of −10 is equivalent to the binary digit 0, and a sample value of 0 is a NULL separator character.

In operation, system 110 detects identifying artifacts in lossy and lossless data. In this manner, the source, date and time of transmission, and other suitable data pertaining to the carrier data can be verified, and other suitable processes can be performed.

Figure 5:
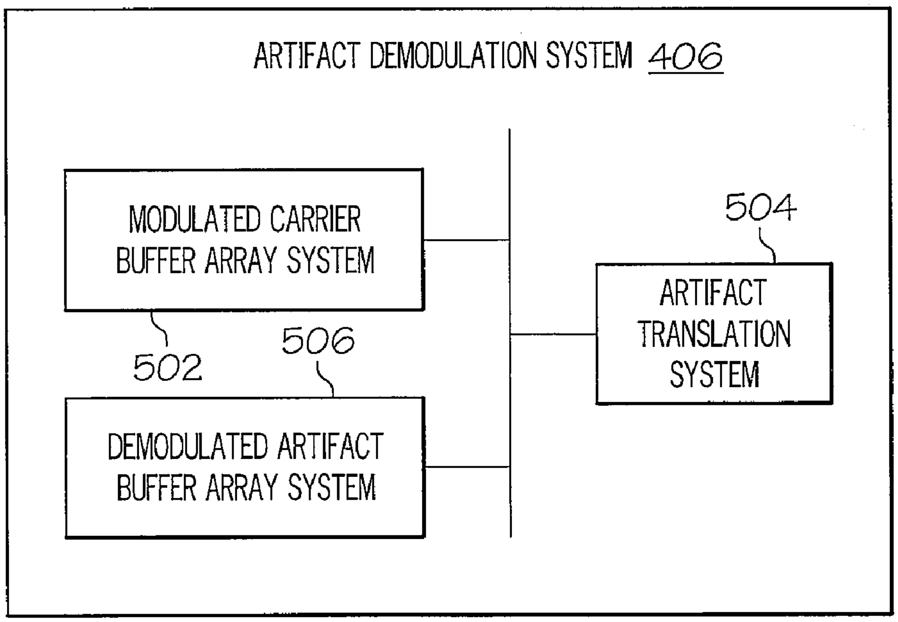
FIG. 5 is a diagram of a system for demodulating identifying artifacts from lossy or lossless carrier data in accordance with an exemplary embodiment of the present invention.

FIG. 5 is a diagram of a system 406 for amplitude demodulating identifying artifacts from lossy or lossless carrier sample sequences in accordance with an exemplary embodiment of the present invention. System 406 includes modulated carrier buffer array system 502, an artifact translation system 504, and a demodulated artifact buffer array system 506, each of which can be implemented in hardware, software, or a suitable combination of hardware and software, and which can be one or more software systems operating on a general purpose server platform.

Modulated carrier buffer array system 502 stores an array of targeted artifact modulated carrier amplitude samples equal to the sample length of the identifying artifact and a predetermined number of samples before and after the target modulated carrier sample set. This array also is marked for use with the artifact modulated carrier slope calculation system 404 and artifact translation system 504.

Artifact translation system 504 translates the carrier sample stream modulated by the identifying artifact amplitude samples. Artifact modulated carrier amplitude samples are taken from the modulated carrier buffer array system 502 and the identifying artifact samples are processed using an algorithm that removes the incremental modulating slope of the carrier from each modulated artifact sample. These are passed to demodulated artifact buffer array system 506 for temporary storage until a full identifying artifact has been translated.

Demodulated artifact buffer array system 506 stores an array of identifying amplitude samples that comprise the identifying artifact. These demodulated artifact samples include the artifact flag and the artifact payload. The artifact flag is two or more samples of equal amplitude where the first sample is a positive integer and the second sample is a negative integer and each successive artifact flag sample is alternatively a positive and negative integer of equal amplitude. The artifact payload data is a predetermined number of samples where the amplitude of the samples contain the identifying data contained in the artifact. When identifying artifact samples fill the array, the samples in the array are assembled into an artifact set that is provided to the artifact error correction system 408 for testing and adjustment.

In operation, system 406 processes artifact modulated carrier data to extract raw identifying artifacts and stores buffered arrays of modulated carrier and raw, demodulated identifying artifact amplitude samples. These identifying artifacts are provided to artifact error correction system 408.

Figure 6:
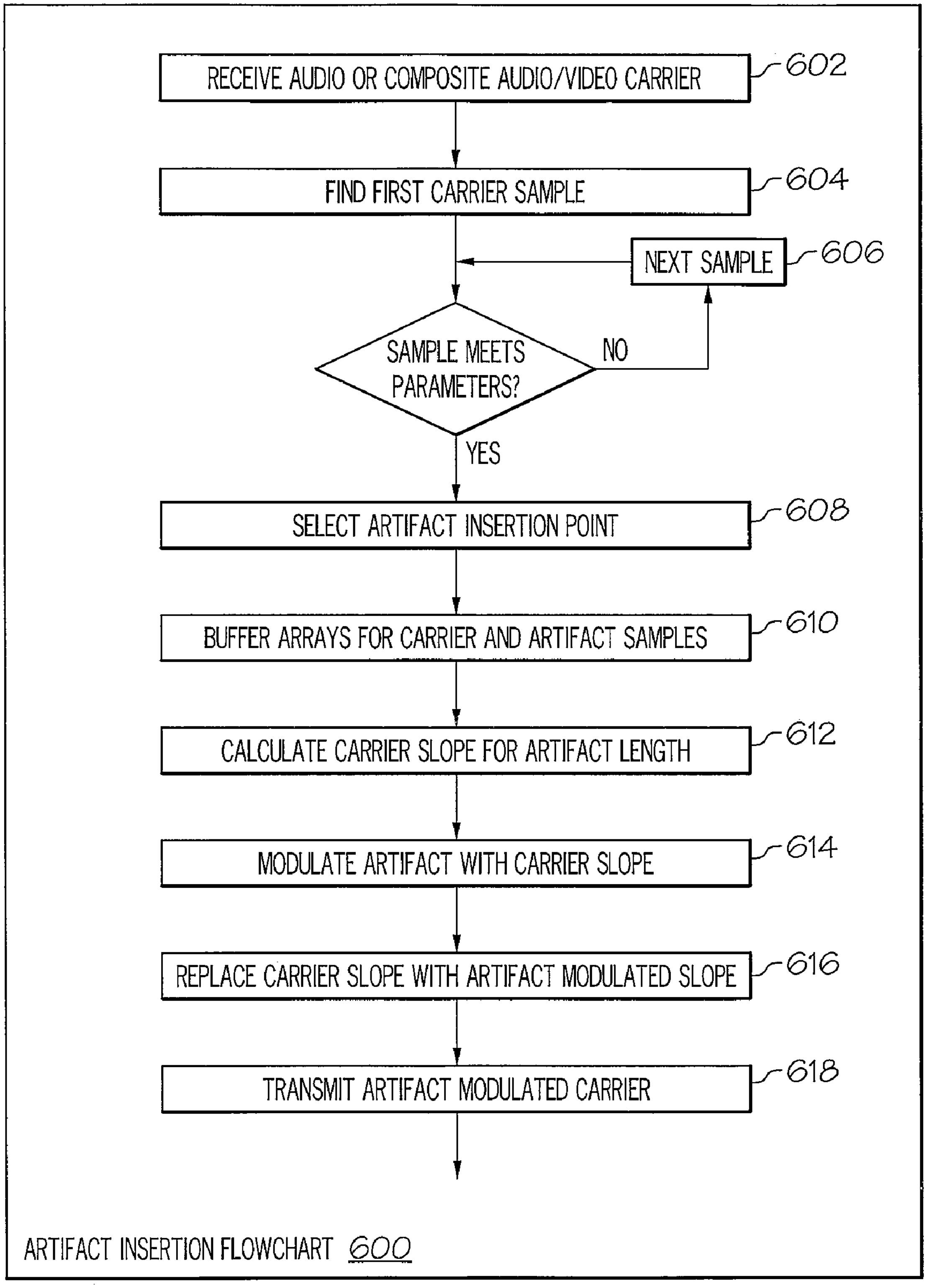
FIG. 6 is a flowchart of a method for inserting identifying artifacts into lossy data in accordance with an exemplary embodiment of the present invention.

FIG. 6 is a flowchart of a method 600 for inserting identifying artifacts into lossy or lossless data in accordance with an exemplary embodiment of the present invention. Method 600 begins at step 602, where the identifying artifact data and carrier data are received. The digital carrier data may be lossy data (such as sampled audio or video frequency data), lossless data (such as audio or video data initially captured in a digital modality), or other suitable data. In one exemplary embodiment, whether the lossy data is an audio data stream, an audio stream associated with video content data, video content data, or both video and audio content data, it can serve as the data carrier. The identifying artifact data can include date and time stamp data, copyright data, quality of the transmission data, or other suitable data. The data to be contained in the identifying artifact can be provided with the carrier data, generated locally when the carrier data is received, or generated in other suitable manners. In another exemplary embodiment, the identifying artifact data can be the key or pointer to a database record that contains more detailed identification information. The method then proceeds to step 604.

At step 604, the first sample of the audio or composite video and audio carrier is identified. In one exemplary embodiment, the carrier format, sample rate, and bit amplitude of the audio carrier or the composite audio and video carrier is identified. The method then proceeds to step 606.

At step 606, the carrier sample is evaluated according to a predetermined set of parameters specific to the application as to carrier sample suitability for an artifact insertion point. In one exemplary embodiment, where identifying artifacts are arbitrarily inserted at a predetermined frequency rate during the length of the carrier, each sample is evaluated for its sample number. The sample numbers of a carrier ($S_n$) are tested to establish the target site for an identifying artifact by dividing the sample number by the artifact insertion rate ($T_r$); a true result for the test establishes the site of the first artifact sample ($S_1$).

$$\text{If } S_n \bmod T_r=0; \tag{1}$$

$$S_n=S_1 \tag{2}$$

If the sample is not evenly divisible by a predetermined insertion rate, the test is advanced to the next sample and is applied to that sample number. If the sample number is evenly divisible by the predetermined insertion rate, the method then proceeds to step 608.

At step 608, the exact location of the first sample in the series of samples that encompass the length of the identifying artifact is defined. The basis for the definition of this location is a predetermined set of parameters specific to the application. To this defined range of samples are added a number of samples before and after the target range for the insertion of the samples of the identifying artifact. This boundary limit for the carrier sample array is provided to step 610.

At step 610, the array of samples that comprise the identifying artifact and the carrier samples contained within the boundary limit defined by step 608 are inserted into buffer arrays for future use. The method then proceeds to step 612.

At step 612, the slope of the carrier in the identifying artifact target range of lossy or lossless carrier samples is determined. The slope of the carrier ($m_c$) must be determined for the length of the identifying artifact (□T) starting from the first modulated artifact sample site ($S_1$) and the amplitude range of the carrier samples (□S). This value is calculated by performing the following calculations:

$$\Delta S=S_l-S_1, \text{ where } S_l \text{ is the last sample in the array}$$

$$\Delta T=T_l-T_1, \text{ where } T_l \text{ is the last sample in the identifying artifact array} \tag{3}$$

$$m_c=\frac{\Delta S}{\Delta T} \tag{4}$$

This produces carrier slope ($m_c$). The method then proceeds to step 614.

At step 614, the samples in the buffered artifact array are modulated to the slope of the lossy or lossless carrier in the targeted range for the insertion of the identifying artifact. The amplitude of each sample that comprises the identifying artifact ($T_a$) is incremented by a factor related to the slope of the carrier at that sample to become a modulated artifact sample ($M_a$) in accordance with the following formula, where the carrier slope is ($m_c$), the amplitude of the first carrier sample is ($S_a$), and the identifying artifact sample position in the array is ($A_n$):

$$M_a=T_a+m_c(A_n-1)+S_a \tag{5}$$

In one embodiment of the present invention, the modulated amplitude value of the identifying artifact may be adjusted to accentuate its position on the carrier slope by including an artifact coefficient (□ in the equation) as follows:

$$M_a=(T_a+m_c(A_n-1)+S_a)(1+\Delta) \tag{6}$$

The method then proceeds to step 616.

At step 616, the modulated carrier is assembled by accessing the buffered carrier array for carrier samples prior to the designated identifying artifact insertion target range. When the carrier sample number that is the first in the target range it reached, the identifying artifact array is accessed so that the first sample in the artifact array replaces the first carrier sample in the insertion target range. This process proceeds until all modulated identifying artifact samples in the artifact array have replaced all carrier samples in the carrier sample target range. When the last modulated identifying artifact sample has been accessed, the array access reverts to the next sample in the carrier array until the last sample in the carrier array is accessed to complete the formation of the composite data sequence. The method then proceeds to step 618.

At step 618, the composite data sequence containing the unaltered carrier samples and the modulated identifying artifact are merged into their proper sequence in the carrier data stream and presented to data transmit system 106.

In operation, method 600 generates a composite data sequence by identifying target areas for the insertion of identifying artifact data and inserting the identifying artifact in one or more locations of the carrier data. Method 600 permits the verification of the receipt of digital content, activation of processes dependent on the transmitted content or carrier data and other relevant functions.

Figure 7:
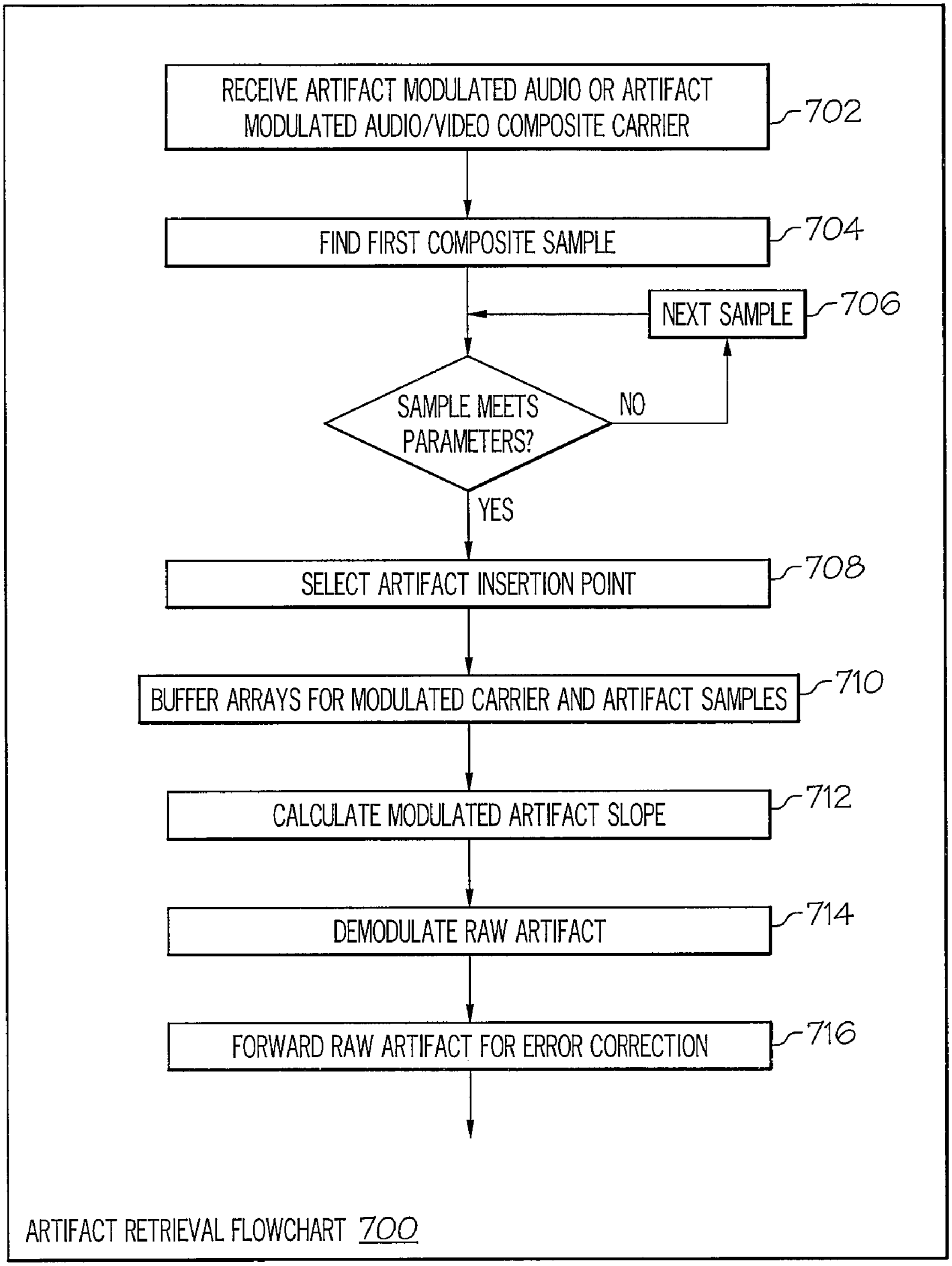
FIG. 7 is a flowchart of a method for retrieving identifying artifacts from lossy or lossless carrier data in accordance with an exemplary embodiment of the present invention.

FIG. 7 is a flowchart of a method 700 for retrieving identifying artifacts from lossy or lossless data in accordance with an exemplary embodiment of the present invention. Method 700 begins at 702 where modulated carrier data are received. The method then proceeds to step 704.

At step 704, the first sample of the audio carrier data modulated by the identifying artifact, composite video and audio carrier data modulated by the identifying artifact or other suitable carrier data modulated by the identifying artifact is identified. The method then proceeds to step 706.

At step 706 the identifying artifact modulated carrier sample is evaluated according to a predetermined set of parameters specific to the application for the identification of an artifact insertion point. In one exemplary embodiment, where identifying artifacts are arbitrarily inserted at a predetermined insertion rate during the length of the carrier, each sample is evaluated for its sample number. The sample numbers of a modulated carrier ($M_n$) are tested to establish the potential site for an identifying artifact by dividing the sample number by the artifact insertion rate ($T_r$); a true result for the test establishes the site of the first artifact sample ($M_1$).

$$\text{If } M_n \bmod T_r=0; \quad [7]$$

$$M_n=M_1 \quad [8]$$

If the modulated carrier sample is not evenly divisible by a predetermined insertion rate, the test is advanced to the next sample and applied to that sample number. If the sample number is evenly divisible by the predetermined insertion rate, the method then proceeds to step 708.

At step 708, the exact location of the first sample in the series of samples that encompass the length of the identifying artifact is defined. The basis for this definition are the predetermined set of parameters specific to the application. In one exemplary embodiment, these samples are evaluated for the presence of an artifact flag. The presence of the artifact flag establishes the beginning of the target range for the identifying artifact and a predetermined identifying artifact length designated by the application determines the end of the target range. To this defined range of modulated samples are added a number of samples before and after the target range for the verification of the presence of an identifying artifact. This boundary limits for the modulated carrier sample array is provided to step 710.

At step 710, the array of samples that comprise the composite data sequence containing the modulated carrier and the identifying artifact within the boundary limits defined by step 708 are inserted into a buffer for future use. In addition, an array is established in buffer memory for the placement of the raw demodulated identifying artifact samples. The method then proceeds to step 712.

At step 712, the slope of the modulated carrier containing the identifying artifact target range is determined. The slope of the modulated carrier ($m_a$) must be determined for the length of the identifying artifact (□T) starting from the first modulated artifact sample site ($M_1$) and the amplitude range of the carrier samples (□M). This value is calculated by performing the following calculations;

$$\Delta M=M_l-M_1, \text{ where } M_l \text{ is the last sample in the array} \quad [9]$$

$\Delta T=T_l-T_1$, where $T_l$ is the last sample in the identifying artifact array $$m_a=\frac{\Delta M}{\Delta T} \quad [10]$$

This produces carrier slope ($m_a$). The method then proceeds to step 714.

At step 714, the samples in the buffered carrier modulated by identifying artifacts array are demodulated from the slope of the lossy or lossless modulated carrier. The amplitude of each sample that comprises the identifying artifact ($M_a$) is decremented to become a raw, demodulated artifact sample ($T_a$) in accordance with the following formula, where the carrier slope is ($m_a$), the amplitude of the first identifying artifact modulated sample is ($M_1$) and the carrier modulated by the identifying artifact sample position in the array is ($A_n$):

$$T_a=M_a-m_cA_n-M_1 \quad [11]$$

The resulting raw demodulated identifying artifact is stored in an array until all carrier samples modulated by the identifying artifact have been processed. The method then proceeds to step 616.

At step 616, the array of raw, demodulated identifying artifact samples is presented to artifact error correction system 408.

In operation, method 700 receives a composite data sequence of lossey or lossless carrier samples modulated by identifying artifacts, locates the target range of identifying artifacts, verifies the precise range of samples containing modulated identifying artifacts, and demodulates the identifying artifact samples into an array of raw identifying artifact samples. Method 700 permits the verification of the receipt of digital content, activation of processes dependent on the transmitted content or carrier data and other relevant functions.

Figure 8:
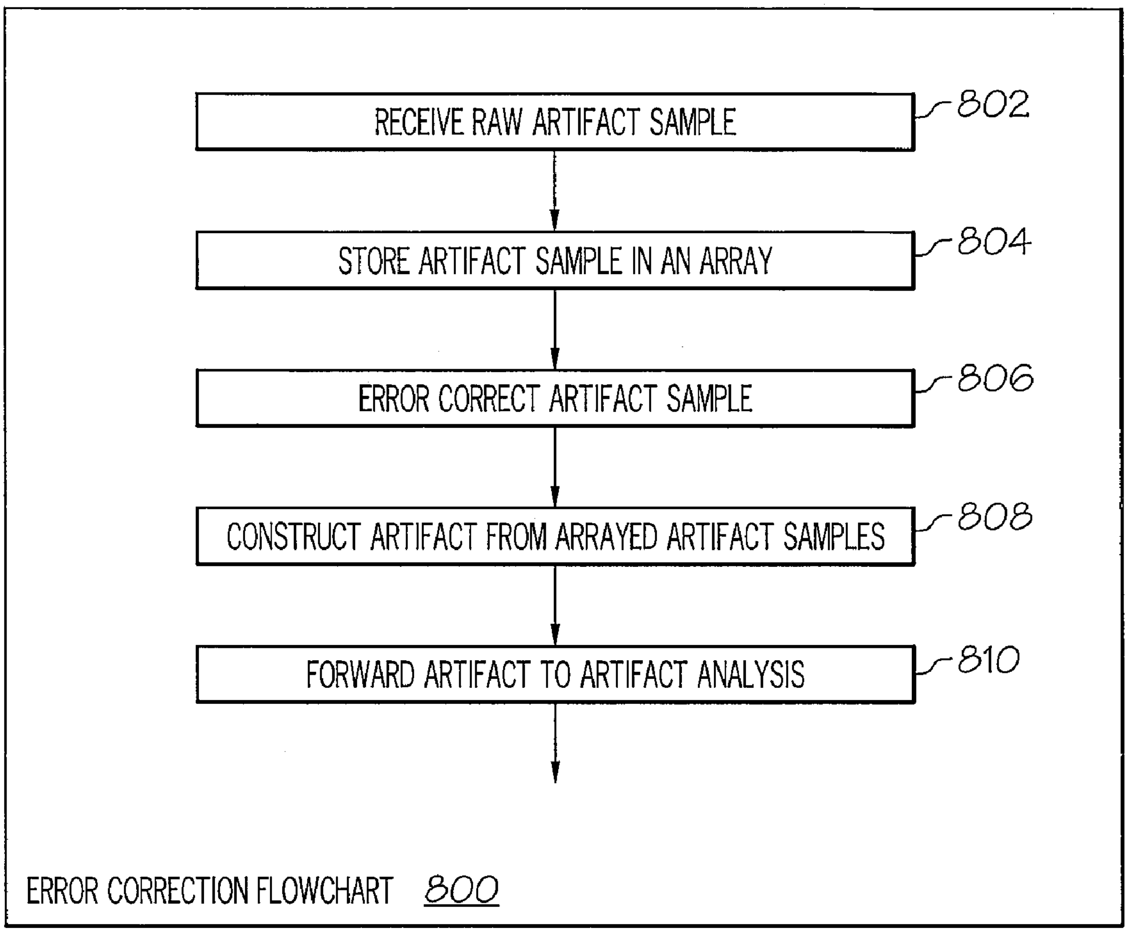
FIG. 8 is a flowchart of a method for the correcting of transmission errors in raw samples of identifying artifact data in accordance with an exemplary embodiment of the present invention.

FIG. 8 is a flowchart of a method 800 for correcting errors in raw, demodulated amplitude samples that comprise the identifying artifact, in accordance with an exemplary embodiment of the present invention. Method 800 begins at step 802, where raw identifying artifact amplitude samples are received. The method then proceeds to step 804.

At step 804, an empty array is created and stored in buffer memory to store the raw demodulated identifying artifact samples in preparation for error correction. The method then proceeds to step 806.

At step 806, each raw demodulated identifying artifact sample is subjected to an appropriate error correction algorithm. In one exemplary embodiment of the present invention, where the identifying artifact payload contains only three possible values (+10, 0 and −10) a simple rounding process may be employed. This simple error correction logic algorithm is applied to the arrayed results of ($T_a$) by testing each raw demodulated artifact sample value in the array as follows:

$$\text{For } T_a>5;\ T_a=10; \quad [12]$$

$$\text{For } T_a>-5;\ T_{a\,n}=-10; \quad [13]$$

$$\text{For } T_a>5 \text{ AND } T_a<-5;\ T_a=0; \quad [14]$$

The method proceeds to step 808.

At step 808, the corrected demodulated identifying artifact sample array is accessed in sequence to construct the identifying artifact data sequence. In one exemplary embodiment of the present invention, where there are only three possible amplitude values for the corrected identifying artifact samples, these values may be assigned in the following manner to translate the samples into a binary string.

$$+10=1 \quad [15]$$

$$-10=0 \quad [16]$$

$$0=\text{NULL (no value)} \quad [17]$$

The array may be accessed to construct a binary string through a process that ignores the NULL samples. This binary string may be further translated through any number of appropriate conversion schemes into decimal, octal or hexadecimal number, or into representational characters. In one exemplary embodiment of the present invention the array may be accessed to construct an ASCII character through the use of a concatenation algorithm. For the array ($A_{1 \ldots 20}$) samples in the array may be converted into ASCII characters through the use of the following concatenation algorithm:

$$C_{ascii}=0\|A_4\|A_6\|A_8\|A_{10}\|A_{12}\|A_{14}\|A_{16}; \quad [18]$$

The method proceeds to step 810.

At step 810, the corrected and assembled identifying artifact is provided to artifact data analysis system 112.

In operation, method 800 receives a raw, demodulated identifying artifact samples, subjects these samples to an error correction process, translates the resulting identifying artifact sample amplitudes into a numeric or character scheme and presents the result for analysis and action. Method 800 permits the verification of the receipt of digital content, activation of processes dependent on the transmitted content or carrier data and other relevant functions.

It will be appreciated by one of ordinary skill in the art that the methods described above may be carried out in software running on one or more processors (not shown), and that the software may be provided as a computer program element carried on any suitable data carrier (also not shown) such as a magnetic or optical computer disc.

Accordingly, the present invention may suitably be embodied as an article of manufacture for use with a computer system. Such an implementation may comprise a series of computer readable instructions fixed on a tangible medium, such as a computer readable medium, for example, diskette, CD-ROM, ROM, or hard disk. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical. It is contemplated that such an article of manufacture may be distributed as a removable medium with accompanying printed or electronic documentation.

As will be appreciated, the processes in preferred embodiments of the present invention may be implemented in an article of manufacture containing computer programming code, firmware or hardware. For example, an article of manufacture containing the computer programming code is used by executing the code directly from the storage device, by copying the code from the storage device into another storage device such as a hard disk, RAM, etc. An apparatus for practicing the invention could be one or more computers and storage systems containing or having network access to computer program(s) coded in accordance with the invention.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A method comprising:

receiving carrier data at a data processing system;

the data processing system analyzing the carrier data to identify one or more insertion areas within carrier data for the insertion of identifying data, wherein the identifying data identifies an association with the carrier data, based on one or more characteristics of the carrier data within a given insertion area indicating that variations of the carrier data at one or more samples within the given insertion area may be imperceptible by a human sensory system;

the data processing system inserting the identifying data in one or more locations of the carrier data based on the identified one or more insertion areas, resulting in modified carrier data containing the identifying data;

storing the modified carrier data in a storage device; and transmitting the modified carrier data from the data processing system.

2. The method according to claim 1, wherein inserting includes modulating amplitude of the carrier data at the one or more locations of the carrier data as a function of amplitude of the identifying data, thereby resulting in the modified carrier data.

3. The method according to claim 1, wherein the identifying data includes date and time stamp data.

4. The method according to claim 1, wherein at least one of the one or more insertion areas within carrier data is identified based on a change in value between two sequential samples of the carrier data acceding a pre-determined amount.

5. The method according to claim 1, further comprising:

sampling the carrier data over a length at least as long as the identifying data to define an insertion area.

6. The method according to claim 5, further comprising:

calculating a slope of the insertion area of the carrier data based on a change of amplitude of the carrier samples over a length of the identifying data.

7. The method according to claim 6, thither comprising:

inserting the identifying data into the carrier data within the identified insertion area based on the slope.

8. The method according to claim 6, wherein the one or more characteristics of the carrier data within the given insertion area include the slope.

9. The method according to claim 1, further wherein the identifying data includes a flag and a payload.

10. The method according to claim 1, further comprising:

transmitting the modified carrier data in the radio frequency spectrum.

11. The method according to claim 1, wherein inserting includes replacing the carrier data within the identified insertion area with modulated identifying data samples.

12. The method according to claim 1, wherein inserting includes:

sampling the carrier data;

sampling the identifying data; and modulating the identifying data by incrementing each sample of the identifying data with a value based on a slope of a carrier data sample over a length of the identifying data within the identified one or more insertion areas for each sample of the identifying data.

13. The method according to claim 1, wherein the carrier data is audio carrier data.

14. The method according to claim 1, wherein the human sensory system is a human auditory system.

15. The method according to claim 1, wherein the human sensory system is a human vision system.

16. The method according to claim 1, wherein the carrier data is audio-visual carrier data.

17. A method comprising:
- receiving modulated carrier data containing identifying data at a data processing system;
- the data processing system sampling the received modulated carrier data;
- the data processing system analyzing the modulated carrier data to determine the amplitude slope of the modulated carrier data corresponding to the one or more samples of the received modulated carrier data;
- the data processing system demodulating the identifying data from the modulated carrier data based on the slope of the modulated carrier data within a predetermined length of the carrier data corresponding to the length of the identifying data to generate demodulated identifying data; and
- storing the demodulated identifying data in a storage device coupled to the data processing system.

18. The method according to claim 17, wherein a location of to identifying data within to modulated carrier data is determined based upon detecting a flag within the carrier data.

19. The method according to claim 17, further comprising verifying the receipt of digital content contained within the carrier data based on the demodulated identifying artifact.

20. The method according to claim 17, wherein the identifying data includes source identifying data referencing the source of the modulated carrier data.

21. The method according to claim 17, further comprising:
- receiving the modulated carrier data in the radio frequency spectrum.

22. The method according to claim 17, wherein demodulating includes:
- decrementing each sample of the carrier data within the predetermined length of the carrier data corresponding to the length of the identifying data with a value based on the slope.

23. The method according to claim 17, wherein the modulated carrier data is audio carrier data.

24. The method according to claim 17, wherein the modulated carrier data is audio-visual carrier data.

25. A system comprising:
- an identifying data insertion system configured to perform:
  - identifying one or more insertion areas within carrier data for the insertion of identifying data, wherein the identifying data identifies an association with the carrier data, based on one or more characteristics of the carrier data within a given insertion area indicating that variations of the carrier data at one or more samples within the given insertion area may be imperceptible by a human sensory system;
  - inserting the identifying data in one or more locations of the carrier data based on the identified one or more insertion areas, resulting in modified carrier data containing the identifying data; and
  - transmitting the modified carrier data.

26. The system according to claim 25, further comprising:
- a transmitter transmitting the modified carrier data in the radio frequency spectrum.

27. The system according to claim 25, further comprising
- a receiver system configured to perform:

receiving modified carrier data containing identifying data;
- sampling the received modified carrier data;
- determining the amplitude slope of the modified carrier data corresponding to the one or more samples of the received modified carrier data; and
- demodulating the identifying data from the modulated carrier data based on the slope of the modulated carrier data within a predetermined length of the carrier data corresponding to the length of the identifying data.

28. The system according to claim 25, wherein the carrier data comprises audio data.

29. The system according to claim 28, wherein inserting includes replacing the carrier data within the identified insertion area with modulated identifying data samples.

30. The system according to claim 28, wherein inserting includes:
- sampling the carrier data;

sampling the identifying data; and
- modulating the identifying data by incrementing each sample of the identifying data with a value based on a slope of a carrier data sample over a length of the identifying data within the identified one or more insertion areas for each sample of the identifying data.

31. The system according to claim 25, wherein inserting includes modulating amplitude of the carrier data at the one or more locations of the carrier data as a function of amplitude of the identifying data, thereby resulting in the modified carrier data.

32. The system according to claim 25, wherein the identifying data includes date and time stamp data.

33. The system according to claim 25, wherein at least one of the one or more insertion areas within carrier data is identified based on a change in value between two sequential samples of the carrier data exceeding a pre-determined amount.

34. The system according to claim 25, wherein the identifying data insertion system further being configured to perform:
- sampling the carrier data ova a length at least as long as the identifying data to define an insertion area.

35. The system according to claim 34, further being configured to perform:
- calculating a slope of the insertion area of the cattier data based on a change of amplitude of the carrier samples over a length of the identifying data.

36. The system according to claim 35, further being configured to perform:
- inserting the identifying data into the carrier data within the identified insertion area based on the slope.

37. The system according to claim 35, wherein the one or more characteristics of the carrier data within the given insertion area include the slope.

38. The system according to claim 25, wherein the human sensory system is a human auditory system.

39. The system according to claim 25, wherein the human sensory system is a human vision system.

40. An article of manufacture comprising a computer-readable medium including program logic embedded therein for causing an apparatus to perform the steps of claim 1.

41. An article of manufacture comprising a computer-readable medium including program logic embedded therein for causing an apparatus to perform the steps of claim 17.

* * * * *